(12) United States Patent
Kim et al.

(10) Patent No.: US 10,852,886 B2
(45) Date of Patent: Dec. 1, 2020

(54) INPUT SENSING UNIT AND ELECTRONIC DEVICE INCLUDING THE SAME

(71) Applicant: Samsung Display Co., Ltd., Yongin-Si (KR)

(72) Inventors: Gayoung Kim, Hwaseong-si (KR); Seunghwan Chung, Seongnam-si (KR); Doik Kim, Suwon-si (KR); Yeonsung Jung, Yongin-si (KR); Inyoung Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 15/964,080

(22) Filed: Apr. 27, 2018

(65) Prior Publication Data

US 2019/0079633 A1    Mar. 14, 2019

(30) Foreign Application Priority Data

Sep. 8, 2017    (KR) .......................... 10-2017-0115413

(51) Int. Cl.
*G06F 3/041* (2006.01)
*G06F 3/044* (2006.01)
*H01L 27/32* (2006.01)

(52) U.S. Cl.
CPC ............ *G06F 3/0418* (2013.01); *G06F 3/044* (2013.01); *G06F 3/0443* (2019.05); *G06F 3/0446* (2019.05); *G06F 3/0448* (2019.05); *H01L 27/323* (2013.01); *G06F 3/0412* (2013.01); *G06F 2203/04111* (2013.01); *G06F 2203/04112* (2013.01)

(58) Field of Classification Search
CPC ......... G06F 3/041; G06F 3/044; G06F 3/0418
See application file for complete search history.

(56) References Cited

U.S. PATENT DOCUMENTS

| | | | |
|---|---|---|---|
| 9,244,573 B2 | 1/2016 | Ryu et al. | |
| 2012/0081334 A1* | 4/2012 | Kim | ........................ G06F 3/044 345/174 |
| 2012/0182233 A1 | 7/2012 | Kim | |

(Continued)

FOREIGN PATENT DOCUMENTS

| | | |
|---|---|---|
| KR | 10-1620463 | 5/2016 |
| KR | 10-1793677 | 11/2017 |
| KR | 10-2018-0090936 | 8/2018 |

*Primary Examiner* — Kent W Chang
*Assistant Examiner* — Chayce R Bibbee
(74) *Attorney, Agent, or Firm* — H.C. Park & Associates

(57) ABSTRACT

An input sensing unit includes may include first sensor patterns arranged in a first direction; first connecting patterns connecting the first sensor patterns; second sensor patterns arranged in a second direction; second connecting patterns connecting the second sensor patterns and being insulated from the first connecting patterns; third sensor patterns; and third connecting patterns connecting the third sensor patterns and being insulated from the first and second connecting patterns, the third connecting patterns having at least one portion having a first surface area crossing one of the first sensor patterns, wherein the at least one portion includes a second surface area overlapping the first sensor pattern, and wherein the second surface area is smaller than the first surface area.

20 Claims, 13 Drawing Sheets

(56) References Cited

U.S. PATENT DOCUMENTS

| | | | |
|---|---|---|---|
| 2016/0117031 A1* | 4/2016 | Han | G06F 3/0412 |
| | | | 345/174 |
| 2017/0147143 A1 | 5/2017 | Jung | |
| 2017/0255303 A1* | 9/2017 | Huang | G06F 3/047 |
| 2018/0059869 A1* | 3/2018 | Ma | G06F 3/0412 |
| 2018/0224984 A1 | 8/2018 | Kim | |

* cited by examiner

INPUT SENSING UNIT AND ELECTRONIC DEVICE INCLUDING THE SAME

CROSS-REFERENCE TO RELATED APPLICATIONS

This application claims priority from and the benefit of Korean Patent Application No. 10-2017-0115413, filed on Sep. 8, 2017, which is hereby incorporated by reference for all purposes as if fully set forth herein.

BACKGROUND

Field

Exemplary embodiments of the invention relate generally to an input sensing unit and an electronic device including the same, and more specifically, to an input sensing unit with capable of reducing noise generation reduced and an electronic device including the same.

Discussion of the Background

An electronic device is activated by receiving an electric signal. The electronic device may include a touch panel detecting various types of inputs applied from the outside. The touch panel may be used alone or with a display device for displaying an image or the like to enhance the convenience of a user.

The electronic device may include various electrode patterns so as to be activated by an electric signal. An area in which the electrode patterns are activated displays information or reacts to an external touch. The complexity of electronic display devices including touch panel, which includes multiple layers of overlapping electrode patterns, can result in undesirable noise that can affect the accuracy of the touch sensing unit in the touch panel.

The above information disclosed in this Background section is only for understanding of the background of the inventive concepts, and, therefore, it may contain information that does not constitute prior art.

SUMMARY

Devices constructed according to exemplary embodiments of the invention are capable of providing an input sensing unit with improved touch sensitivity and an electronic device including the same.

According to one or more embodiments of the invention, an input sensing unit may include first sensor patterns arranged in a first direction; first connecting patterns connecting the first sensor patterns; second sensor patterns arranged in a second direction; second connecting patterns connecting the second sensor patterns and being insulated from the first connecting patterns; third sensor patterns; and third connecting patterns connecting the third sensor patterns and being insulated from the first and second connecting patterns, the third connecting patterns having at least one portion having a first surface area crossing one of the first sensor patterns, wherein the at least one portion may include a second surface area overlapping the first sensor pattern, and wherein the second surface area may be smaller than the first surface area.

The at least one portion may include: a first section overlapping the first sensor pattern; and a second section not overlapping the first sensor pattern, and wherein the first sensor pattern may include an opening overlapping the second section.

The first section may include a plurality of areas spaced apart from each other with the second section disposed therebetween.

At least one of the first sensor patterns may include: a plurality of first mesh lines each extending in a first direction; and a plurality of second mesh lines each extending in a second direction crossing the first direction at cross points at which the first mesh lines and the second mesh lines cross each other, the plurality of first and second mesh lines defining a plurality of mesh openings, wherein the first section may overlap at least one of cross points and the second section may overlap at least one of the mesh openings.

The first section may extend in at least one of the first direction and the second direction, and overlap at least one of the first mesh lines and the second mesh lines, and wherein the at least one of the mesh lines may extend in a direction crossing the first section.

The first section may have a generally linear shape extending in a different direction than the first direction and the second direction.

At least one of the first sensor patterns may include: a plurality of first mesh lines extending in a first direction; and a plurality of second mesh lines extending in a second direction crossing the first direction defining cross points and openings overlapping the first mesh lines, wherein the first section may be disposed between the cross points to overlap the first mesh lines and the second mesh lines and not overlap the cross points, and wherein the second section may overlap the openings.

The first section may have a generally zigzag shape including a portion extending in the first direction and a portion extending in the second direction.

The first connecting pattern may be disposed on a layer different from that of the second connecting pattern, and the first connecting pattern is disposed on the same layer as that of the third connecting pattern.

The input sensing unit may further include an insulation layer disposed between the first connecting pattern and the second connecting pattern, wherein at least a part of the second sensor patterns may be formed to pass through the insulation layer and be connected to the second connecting pattern, and wherein at least a part of the third sensor patterns may be formed to pass through the insulation layer and be connected to the third connecting pattern.

The second sensor pattern may surround the third sensor pattern.

According to one or more exemplary embodiments of the invention, an electronic device may include: a display unit configured to display an image; and an input sensing unit including a touch sensor including: a first sensing electrode disposed on the display unit to receive a first signal; a second sensing electrode configured to receive a second signal and form capacitance with the first sensing electrode; and a noise sensor including a third sensing electrode configured to receive a third signal different from the first and second signals, wherein the third electrode may include: a plurality of sensor patterns arranged in a first direction; and a plurality of connecting patterns disposed between adjacent sensor patterns of the plurality of sensor patterns to connect the adjacent sensor patterns to each other, and wherein each of the plurality of connecting patterns may include: a plurality of overlap portions spaced apart from each other and overlapping the first sensing electrode; and a connecting portion disposed between the overlap portions and not overlapping the first sensing electrode.

The first sensing electrode may include an opening overlapping the connecting portion.

The first sensing electrode may include a plurality of mesh lines crossing each other at cross points, wherein at least one of the plurality of overlap portions may overlap one of the cross points of the mesh lines, and wherein the mesh lines may not overlap the connecting portion.

At least one of the connecting patterns may include: a first portion having a first surface area crossing the first sensing electrode; and a second portion having a second surface area overlapping the first sensing electrode, and wherein the second surface area may be less than the first surface area.

The first sensing electrode may include a plurality of mesh lines crossing each other, and crossing the connecting patterns at the plurality of overlap areas.

The first sensing electrode may further include: a plurality of first sensor patterns arranged in a second direction crossing the first direction; and a plurality of first connecting patterns respectively disposed between adjacent ones of the plurality of first sensor patterns to connect adjacent first sensor patterns to each other, wherein the second sensing electrode may further include: a plurality of second sensor patterns arranged in the first direction; and a plurality of second connecting patterns respectively disposed between adjacent ones of the plurality of second sensor patterns to connect adjacent second sensor patterns to each other, and wherein the connecting patterns may be spaced apart from the first connecting patterns and the second connecting patterns.

The connecting patterns may be disposed on the same layer as that of the first connecting patterns and disposed on a layer different from that of the second connecting pattern.

The first sensing electrode may be supplied with an alternating current voltage.

The display unit may include an organic light emitting diode including a first electrode, a second electrode disposed on the first electrode, and a light emitting layer disposed between the first electrode and the second electrode, and wherein the noise sensor may be disposed on the second electrode.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
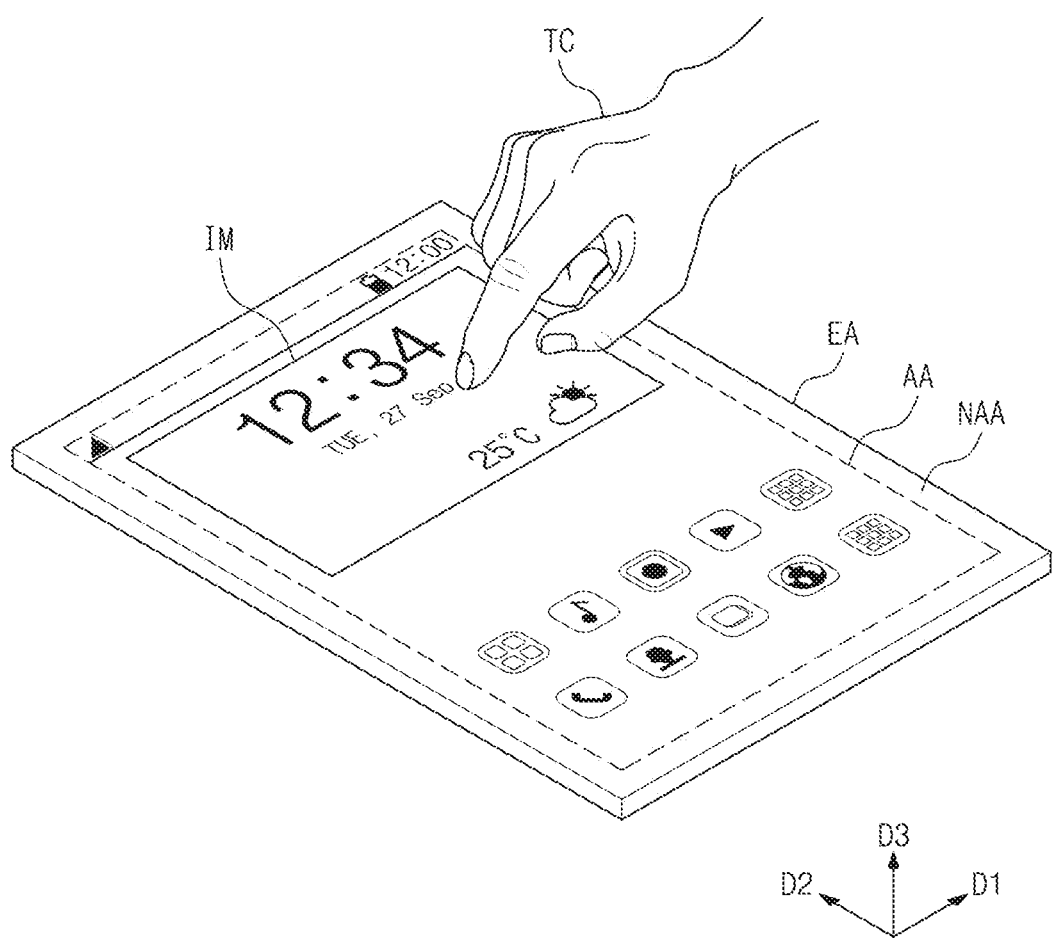
FIG. 1 is a perspective view of an electronic device according to an exemplary embodiment.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

As used herein, where two components are described as "crossing each other" each of the two components extends in a different, intersecting direction. Two components "crossing each other" may be disposed on the same layer as each other or in different layers. As used herein, where two components are described as "overlapping each other" that the two components overlap each other vertically in a plan view. It is assumed that the two components "overlapping each other" are disposed on different layers. That is, according to the exemplary embodiments herein, two components crossing each other may include any embodiment where two components overlap, including entirely overlapping, entirely non-overlapping, or partially overlapping. This will be described later in detail.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
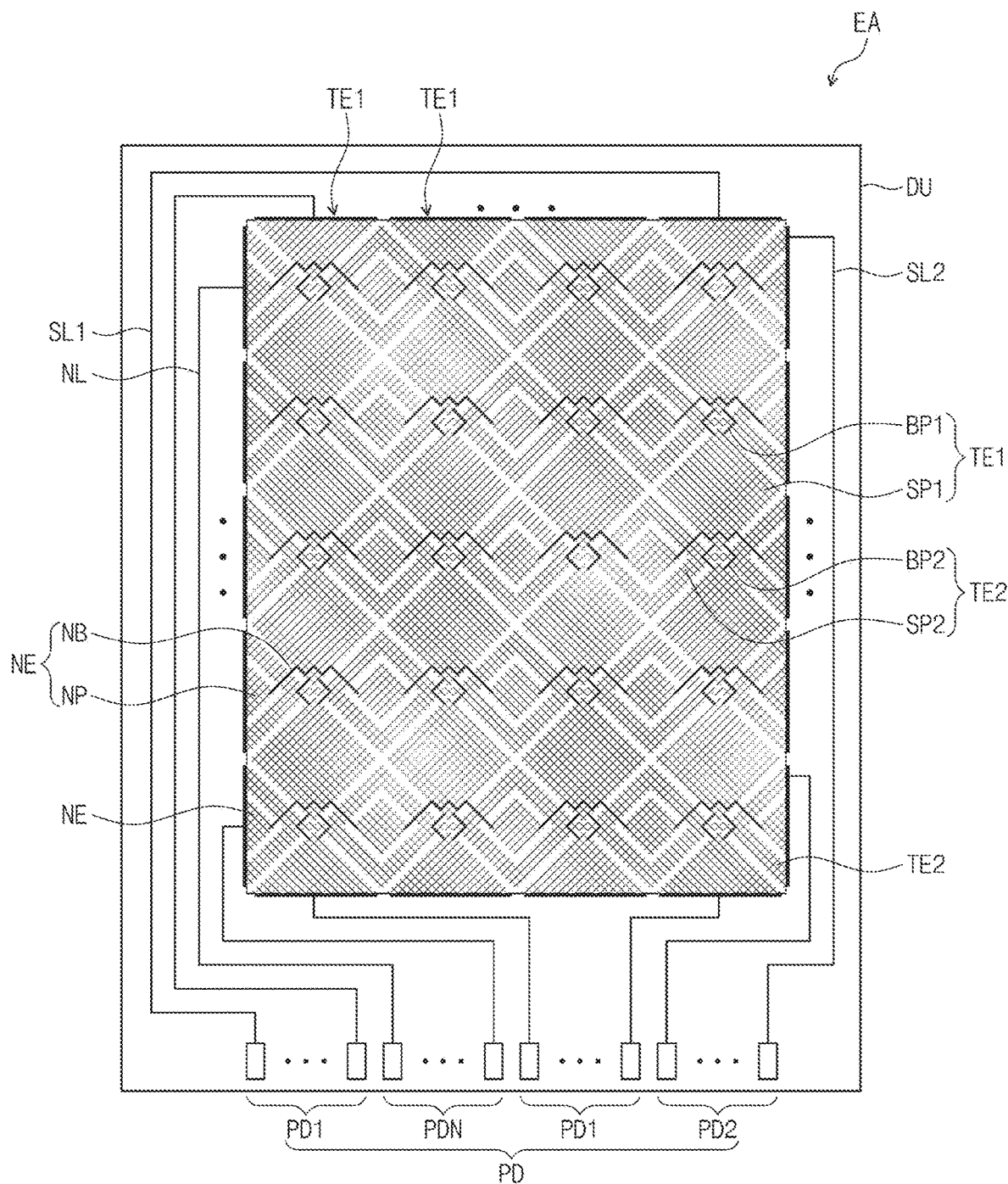
FIG. 2A is a schematic plan view of the electronic device in FIG. 1, according to the exemplary embodiment.
Figure 2B:
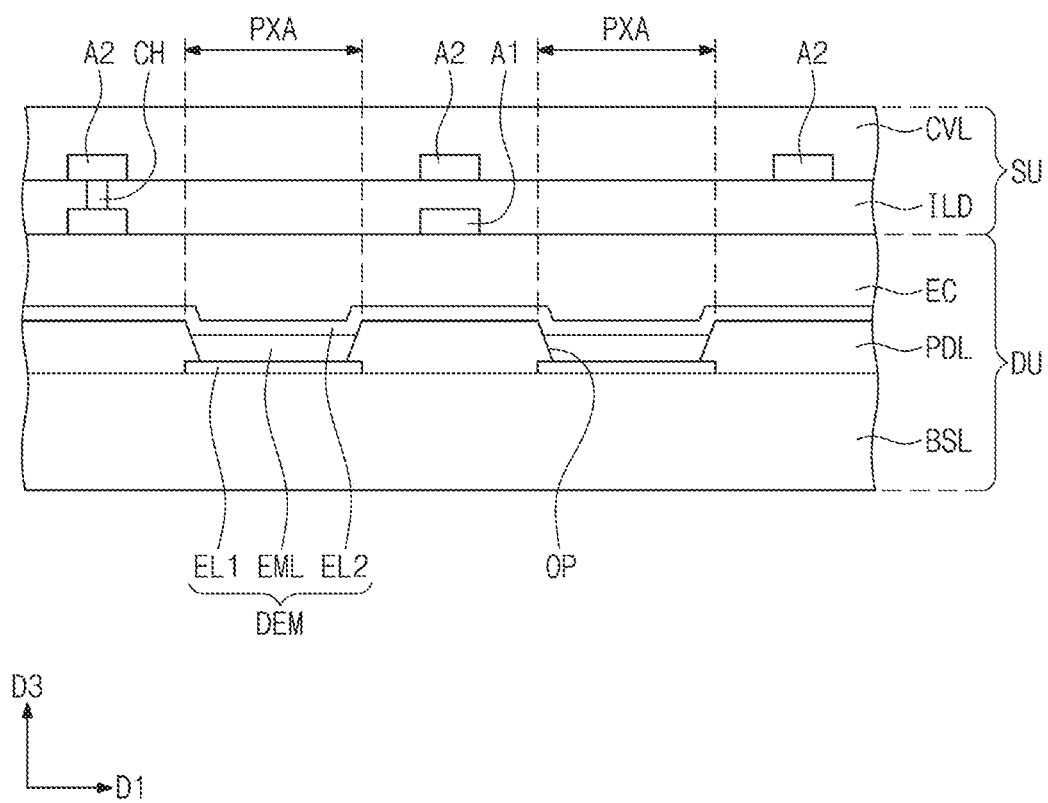
FIG. 2B is a schematic cross sectional view illustrating a portion of the electronic device in FIG. 1, according to the exemplary embodiment.

FIG. 1 is a perspective view of an electronic device according to an exemplary embodiment. FIG. 2A is a schematic plan view of the electronic device in FIG. 1, according to the exemplary embodiment. FIG. 2B is a schematic cross sectional view illustrating a portion of the electronic device in FIG. 1, according to the exemplary embodiment. Hereinafter, an electronic device EA according to an exemplary embodiment will be described with reference to FIGS. 1, 2A, and 2B.

The electronic device EA is operated by receiving an electric signal. The electronic device EA may be divided into an active area AA and a peripheral area NAA in a plan view of a plane defined by a first direction D1 and a second direction D2.

The active area AA may be electrically activated when an electric signal is provided. The active area AA may be activated to have various functions known in the art according to the purpose(s) of the electronic device EA.

For example, the active area AA may be a sensing area detecting an external input (or a touch control) applied from the outside. As illustrated in FIG. 1, the electronic device EA may detect an external input TC applied to the active area AA. In this aspect, the electronic device EA may serve as an input device.

Although a hand of a user is illustrated as an example of the external input TC, the external input may be provided in various forms. For example, the input may include various types of input such as force, pressure, and/or light in addition to a touch that is generated such that a portion of a human body such as a user's hand contacts or disposed adjacent thereto. However, the exemplary embodiments are not limited thereto.

According to the exemplary embodiments, the active area AA may be a display area for displaying predetermined information. The electronic device EA displays an image on the active area AA, and the user acquires information through the image. In this aspect, the electronic device EA may serve as an output device.

The peripheral area NAA is disposed adjacent to the active area AA. Although an electric signal is applied to the electronic device EA, the peripheral area NAA does not provide a function for displaying an image to the outside or detecting an external input.

The peripheral area NAA may be an area which includes signal lines for providing a signal applied from the outside to the active area AA and driving elements for driving the active area AA.

The peripheral area NAA may be disposed adjacent to one side of the active area AA.

According to the exemplary embodiment, the peripheral area NAA may have a frame shape surrounding the active area AA. However, this is merely an exemplary illustration. For example, a display panel 200 according to an exemplary embodiment may not include the peripheral area NAA. The peripheral area NAA may have various shapes, and the exemplary embodiments are not limited thereto.

Referring to FIGS. 1 and 2A, the electronic device EA according to the exemplary embodiment is a touch screen device. For example, the electronic device EA includes a display unit DU and an input sensing unit SU. However, this is merely an exemplary illustration. For example, the electronic device EA may not include the display unit DU.

Referring to FIG. 2B, the display unit DU may include a base layer BSL, a pixel defining layer PDL, a display element DEM, and an encapsulation layer EC. The display unit DU may include a plurality of light emitting areas (or pixel areas) PXA arranged in the active area AA. FIG. 2B illustrates an area in which two light emitting areas PXA of the light emitting areas are disposed.

The base layer BSL may include a plurality of insulation layers and a plurality of conductive layers. The plurality of insulation layers and the plurality of conductive layers may constitute a thin film transistor and a capacitor, which are connected to the display element DEM.

The pixel defining layer PDL is disposed on the base layer BSL. Predetermined openings OP are defined in the pixel defining layer PDL. The openings OP may define light emitting areas PXA, respectively.

The display element DEM is disposed on the base layer BSL. The display element DEM may be disposed in each of the openings OP. The display element DEM emits light according to an electric signal transmitted through the thin film transistor and the capacitor to display an image.

The display element DEM may include various exemplary embodiments. For example, the display element DEM may include an electrophoretic element, a liquid crystal capacitor, an electrowetting element, an organic light emitting diode, and/or other light emitting units known in the art. In this exemplary embodiment, an organic light emitting diode will be described as the display element DEM. The display element DEM includes a first electrode EL1, a light emitting layer EML, and a second electrode EL2. The display element DEM may activate a light emitting layer EML according to an electric potential difference applied between the first electrode EL1 and the second electrode EL2 to generate light. Accordingly, the light emitting areas PXA may correspond to an area in which the light emitting layer EML is disposed.

According to the exemplary embodiments, each of the light emitting areas PXA may have different sizes from each other. For example, each of the light emitting areas PXA may have a different size according to colors of light emitted therefrom. As a light emitting area having a size suitable for each of different colors, the light emitting area may have a uniform light efficiency for various lights having different colors.

The encapsulation layer EC covers the display element DEM. The encapsulation layer EC may include at least one inorganic layer and one organic layer. The encapsulation layer EC prevents or reduces introduction of moisture into the display element DEM and protects the display element DEM. Also, the encapsulation layer EC may be disposed between the display element DEM and the input sensing unit SU to electrically separate or insulate the display element DEM from the input sensing unit SU.

The input sensing unit SU is disposed on the encapsulation layer EC. However, this is merely an exemplary illustration. For example, the input sensing unit SU may be disposed below the encapsulation layer EC. Meanwhile, the electronic device EA may further include a member such as a color filter disposed between the input sensing unit SU and the encapsulation layer EC.

The input sensing unit SU includes a first conductive layer A1, an insulation layer ILD, a second conductive layer A2, and a cover layer CVL. Each of the first conductive layer A1 and the second conductive layer A2 may include a plurality of conductive patterns. The conductive patterns may include connecting patterns BP1, BP2, and NB and mesh lines MSL, which are described above.

Each of the first conductive layer A1 and the second conductive layer A2 may constitute a first sensing electrode TE1, a second sensing electrode TE2, and a third sensing electrode NE. For example, the first conductive layer A1 may include a first connecting pattern BP1 and a third connecting pattern NB, and the second conductive layer A2 may include a first sensor pattern SP1, a second sensor pattern SP2, and a second connecting pattern BP2. Here, a portion of the first conductive layer A1 may be connected to a portion of the second conductive layer A2 through a contact hole CH. However, this is merely an exemplary illustration. For example, each of the first conductive layer A1 and the second conductive layer A2 may include various constitutions of the first sensing electrode TE1, the second sensing electrode TE2, and the third sensing electrode NE, the exemplary embodiments are not limited thereto.

Each of the first conductive layer A1 and the second conductive layer A2 may be disposed in an area overlapping the pixel defining layer PDL. Each of the first conductive layer A1 and the second conductive layer A2 may not overlap the light emitting areas PXA. Accordingly, the input sensing unit SU may have a reduced influence on an image displayed through the light emitting areas PXA. However, this is merely an exemplary illustration. For example, each of the first conductive layer A1 and the second conductive layer A2 may overlap at least a portion of the light emitting areas PXA.

The insulation layer ILD is disposed between the first conductive layer A1 and the second conductive layer A2. The insulation layer ILD enables the first conductive layer A1 and the second conductive layer A2 to be spaced apart and separated from each other on a cross-section. A portion of each of the first conductive layer A1 and the second conductive layer A2 may be electrically connected to each other through the contact hole CH passing through the insulation layer ILD.

The insulation layer ILD may be electrically insulating. The insulation layer ILD may include an organic material and/or an inorganic material.

The cover layer CVL covers mesh wires MSL to protect the mesh wires MSL. The cover layer CVL may have an electrically insulating property. The cover layer CVL may include at least one inorganic layer and/or one organic layer.

FIG. 2A mainly illustrates the input sensing unit SU disposed above the display unit DU. The input sensing unit SU includes a plurality of first sensing electrodes TE1, a plurality of second sensing electrodes TE2, a plurality of third sensing electrodes (or noise sensing electrodes) NE, a plurality of first lines SL1, a plurality of second lines SL2, a plurality of third lines (or noise sensing lines) NL, and a plurality of pads PD. The plurality of pads include first pads PD1, second pads PD2, and third pads PDN The first sensing electrodes TE1 are arranged in a first direction D1. Each of the first sensing electrodes TE1 extends in a second direction D2. Each of the first sensing electrodes TE1 may include a plurality of first sensor patterns SP1 and a plurality of first connecting patterns (or first bridging patterns) BP1.

The first sensor patterns SP1 and the first connecting patterns BP1 are arranged in the second direction D2. The first connecting patterns BP1 are respectively disposed between the first sensor patterns SP1. The first sensor patterns SP1 are electrically connected to each other through the first connecting patterns BP1.

The plurality of first lines SL1 are respectively connected to the first sensing electrodes TE1. The plurality of first lines SL1 respectively connect the first sensing electrodes TE1 to a plurality of pads PD respectively corresponding thereto. According to the exemplary embodiment, the plurality of first lines SL1 respectively connect the first sensing electrodes TE1 to the first pads PD1. The plurality of first lines SL1 transmit electric signals provided through the first pads PD1 to the first sensing electrodes TE1 and transmit electric signals provided from the first sensing electrodes TE1 to the outside through the first pads PD1.

The second electrodes TE2 are arranged in the second direction D2. Each of the second electrodes TE2 extends in the first direction D1. Each of the first sensing electrodes TE1 may include a plurality of second sensor patterns SP2 and a plurality of second connecting patterns (or second bridging patterns) BP2.

The second sensor patterns SP2 and the second connecting patterns BP2 are arranged in the first direction D1. The second connecting patterns BP2 are respectively disposed between the second sensor patterns SP2. The second sensor patterns SP2 are electrically connected to each other through the second connecting patterns BP2.

The plurality of second lines SL2 are respectively connected to the second sensing electrodes TE2. The plurality of second lines SL2 respectively connect the second sensing electrodes TE2 to the second pads PD2 of the pads PD. The plurality of second lines SL2 transmit electric signals provided through the second pads PD2 to the second sensing electrodes TE2 or transmit electric signals provided from the second sensing electrodes TE2 to the outside through the second pads PD2.

The second sensing electrodes TE2 may receive an electric signal different from that of the first sensing electrodes TE1. Here, the second sensing electrodes TE2 may provide or generate an electric field together with the first sensing electrodes TE1. The input sensing unit SU may sense an external touch TC through variation, which is caused by the external touch TC, in capacitance that is mutually formed between the second sensing electrodes TE2 and the first sensing electrodes TE1.

Alternatively, the second sensing electrodes TE2 may receive the same electric signal as that of the first sensing electrodes TE1. Here, the input sensing unit SU may sense an external touch TC through variation, which is caused by the external touch TC, in capacitance that is formed by each of the second sensing electrodes TE2 and the first sensing electrodes TE1.

The third sensing electrodes NE are arranged in the second direction D2. Each of the third sensing electrodes NE extends in the first direction D1. Each of the third sensing electrodes NE may include a plurality of third sensor patterns NP and a plurality of third connecting patterns (or third bridging patterns) NB.

The third sensor patterns NP and the third connecting patterns NB are arranged in the first direction D1. The third connecting patterns NB are respectively disposed between the third sensor patterns NP. However, this is merely an exemplary illustration. For example, the third sensing electrodes NE may be arranged in the first direction D1.

According to the exemplary embodiment, each of the third sensor patterns NP may has a shape surrounded by each of the second sensor patterns SP2. For example, each of the third sensor patterns NP may have a substantially rhombus shape including sides each extending in a fourth direction D4 and a fifth direction D5, and each of the second sensor patterns SP2 may have a substantially rhomboid, ring shape surrounding each of the third sensor patterns NP. However, this is merely an exemplary illustration. For example, each of the first to third sensor patterns SP1, SP2, and NP may have various shapes.

The third connecting patterns NB are respectively disposed between the third sensor patterns NP. The third sensor patterns NP are electrically connected to each other through the third connecting patterns NB. The third connecting patterns NB may cross the third sensor patterns NP, the second sensor patterns SP2, and the first sensor patterns SP1.

Here, the third connecting patterns NB may partially overlap the first sensor patterns SP1. A portion of the first sensor patterns SP1 may be removed so that the first sensor patterns SP1 do not overlap the third connecting patterns NB. Accordingly, a portion of the third connecting patterns NB disposed on the first sensor patterns PS1 may not be overlapping with the first sensor patterns SP1 in a plan view.

The third lines NL are respectively connected to the third sensing electrodes NE. The third lines NL respectively connect the third sensing electrodes NE to the third pads PDN of the pads PD. The third lines NL transmit electric signals provided through the third pads PDN to the third sensing electrodes NE or transmit electric signals provided from the third sensing electrodes NE to the outside through the third pads PDN.

According to the exemplary embodiment, the third sensing electrodes NE may receive an electric signal that is different from that of each of the first and second sensing electrodes TE1 and TE2. The third sensing electrodes NE may sense noise generated in the active area AA.

In detail, the third sensing electrodes NE may generate an electric signal corresponding to the second electrode EL2 of the display unit DU by a coupling phenomenon. The electric signal generated in the third sensing electrodes NE may be transmitted to the outside through the third pads PDN.

According to an exemplary embodiment, since the input sensing unit SU is disposed on and adjacent to the display unit DU, the input sensing unit SU may be affected by the electric signal provided to the display unit DU. Particularly, the noise caused by driving of the display unit DU may be generated in a portion of the active area AA, and the noise may have an adverse affect or cause error on driving of the input sensing unit SU. The input sensing unit SU may sense such noise by sensing variation in capacitance provided between the third sensing electrodes NE and the second electrode EL2. Accordingly, the noise generated in the active area AA may be easily sensed.

Figure 3:
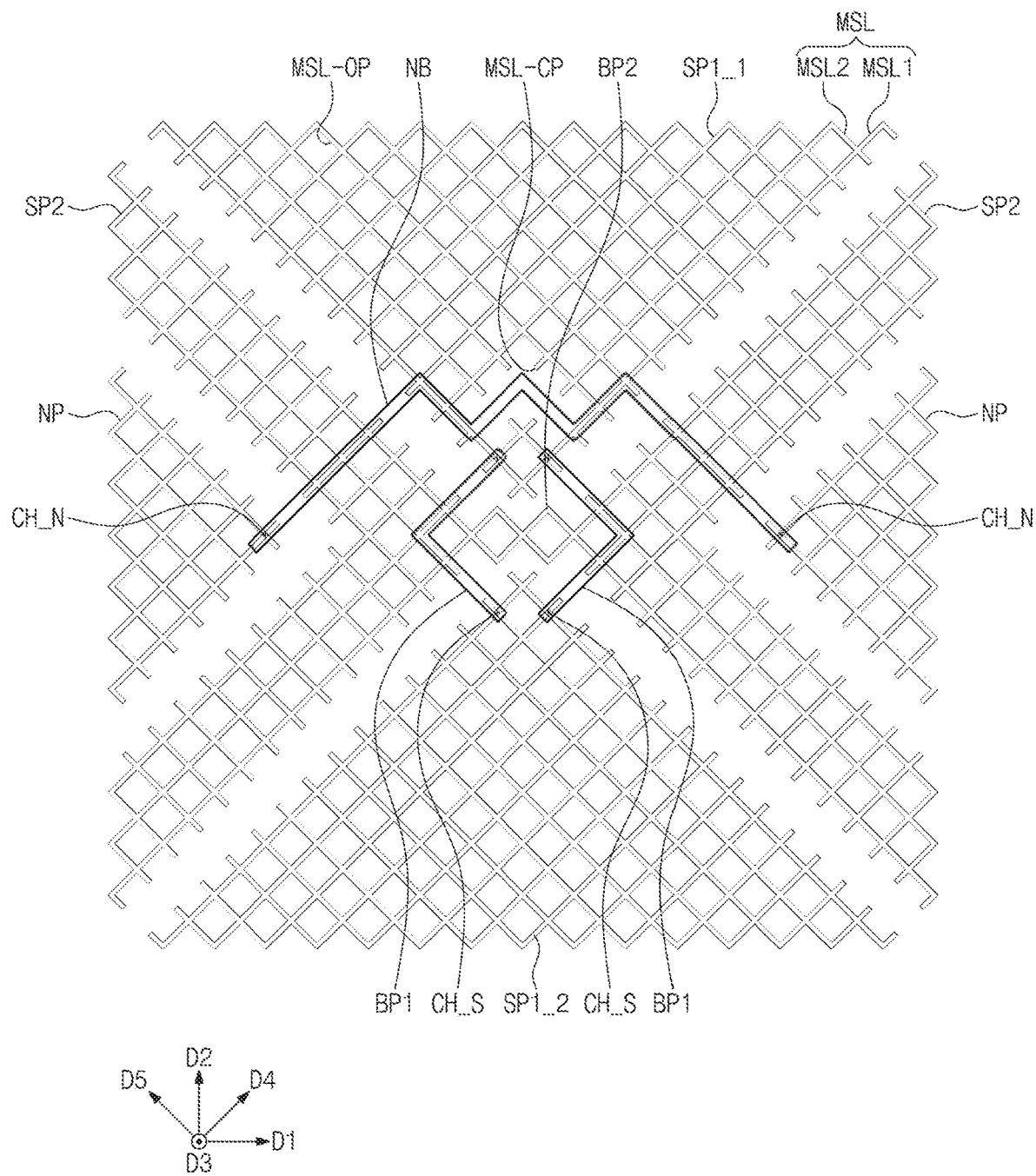
FIG. 3 is a plan view illustrating a portion of an input sensing unit in FIG. 2A, according to the exemplary embodiment.
Figure 4A:
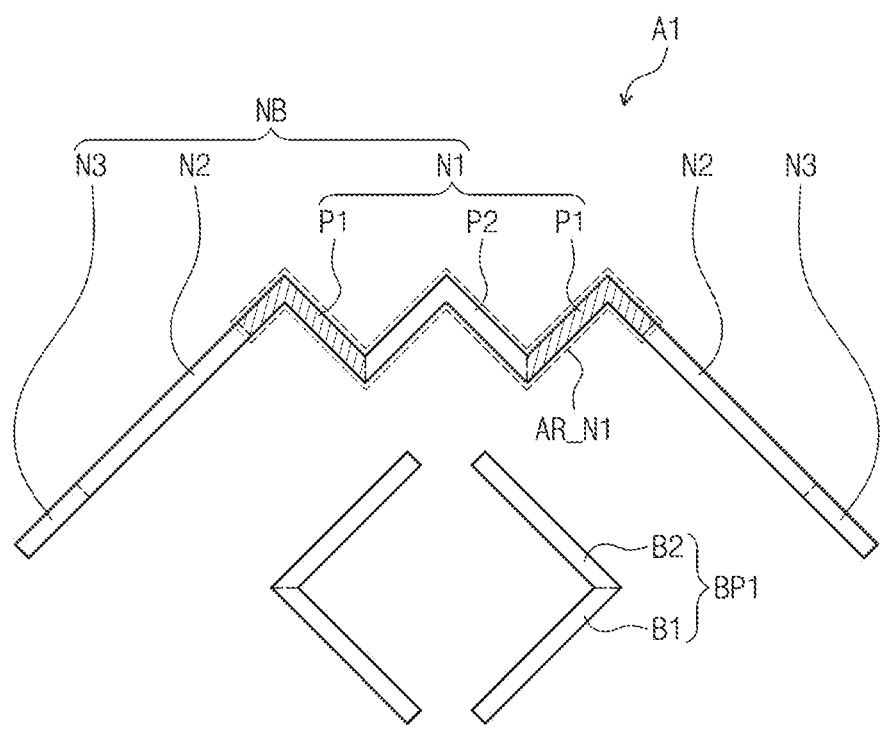
FIGS. 4A and 4B are plan views illustrating a portion of components in FIG. 3, according to the exemplary embodiment.
Figure 4B:
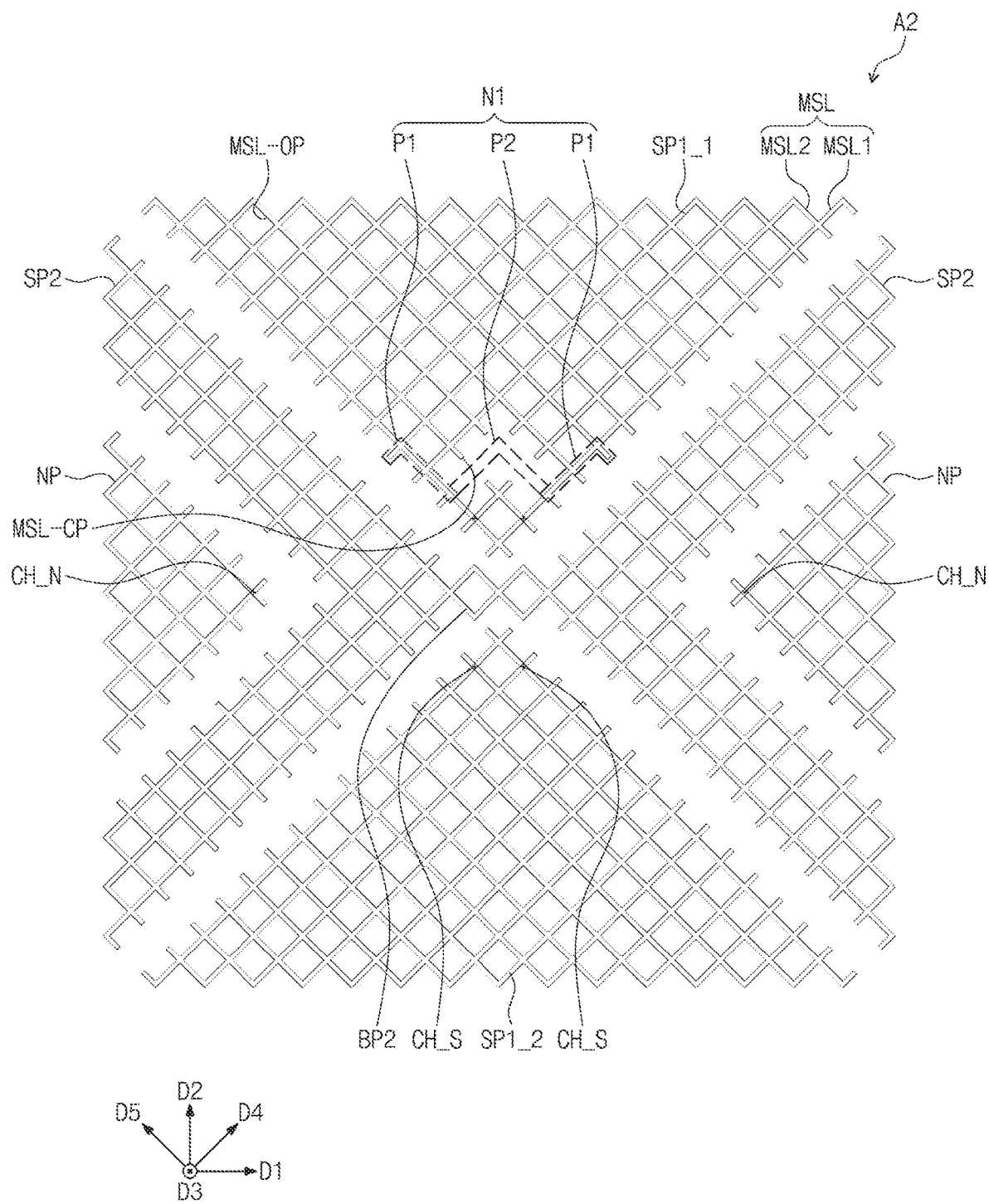

FIG. 3 is a plan view illustrating a portion of the input sensing unit in FIG. 2A, according to the exemplary embodiment. FIGS. 4A and 4B are plan views illustrating a portion of components in FIG. 3, according to the exemplary embodiment. FIG. 3 illustrates a partial area of the active area AA where the first sensing electrode TE1 (refer to FIG. 2A) and the second sensing electrode TE2 (refer to FIG. 2A) cross each other. The area in FIG. 3 may be one node constituting a base unit for sensing the external touch TC (refer to FIG. 1).

Referring to FIG. 3, two first sensor patterns SP1_1 and SP1_2 and a first connecting pattern BP1 are exemplarily illustrated as a portion of the first sensing electrode TE1, two second sensor patterns SP2 and a second connecting pattern BP2 are exemplarily illustrated as a portion of the second sensing electrode TE2, and two third sensor patterns NP and a third connecting pattern NB are exemplarily illustrated as a portion of the third sensing electrode NB (refer to FIG. 2A).

Components disposed on different layers are separately illustrated in FIGS. 4A and 4B for convenience of description. In detail, FIG. 4A illustrates components included in a first conductive layer A1 among the components in FIG. 3, and FIG. 4B illustrates components included in a second conductive layer A2 among the components in FIG. 3. Hereinafter, the input sensing unit SU according the exemplary embodiment will be described with reference to FIGS. 3, 4A, and 4B.

As illustrated in FIG. 3, each of the first sensor patterns SP1_1 and SP1_2, the second sensor patterns SP2, and the third sensor patterns NP may include a plurality of mesh lines MSL. The mesh lines MSL include a first mesh line MSL1 extending in the fourth direction D4 and a second mesh line MSL2 extending in the fifth direction D5.

The first mesh line MSL1 and the second mesh line MSL2 cross each other and are connected to each other. Each of the first sensor patterns SP1_1 and SP1_2, the second sensor patterns SP2, and the third sensor patterns NP may include a plurality of openings MSL-OP defined by the mesh lines MSL. The plurality of openings MSL-OP may respectively correspond to the above-described light emitting areas PXA (refer to FIG. 2B).

Referring to FIGS. 3 and 4A, the first connecting pattern BP1 and the third connecting pattern NB may constitute the first conductive layer A1. The first connecting pattern BP1 may include a first portion B1 and a second portion B2, which extend in different directions from each other. The first portion B1 may extend in the forth direction D2, and the second portion B2 may extend in the fifth direction D5.

The first connecting pattern BP1 may have the same width as that of the mesh lines MSL. Here, the first portion B1 may be formed by the first mesh line MSL1, and the second portion B2 may be formed by the second mesh line MSL2. However, this is merely an exemplary illustration. For example, the first connecting pattern BP1 may be formed by a conductive pattern having a width greater than that of the mesh lines MSL, the exemplary embodiments are not limited thereto.

The first connecting pattern BP1 may be provided in plurality. The first connecting patterns BP1 may be disposed spaced apart from each other in the first direction D1. Each of the first connecting patterns BP1 connects two first sensor patterns SP1_1 and SP1_2 to each other.

The third connecting pattern NB may include a first portion N1, a second portion N2, and a third portion N3. The first portion N1, the second portion N2, and the third portion N3 may refer to portions of the third connecting pattern NB that crosses different components of the second conductive layer A2. Referring to FIG. 4B, the first portion N1 crossing the first sensor pattern SP1_1 is indicated by a dotted line for convenience of description.

Referring to FIGS. 4A and 4B, the third connecting pattern NB may be crossed with the first sensor pattern SP1_1 of the two first sensor patterns SP1_1 and SP1_2. Hereinafter, the first sensor pattern SP1_1 crossed by the third connecting pattern NB may be referred to as an overlap sensor pattern SP1_1. The first portion N1 may be a portion of the third connecting pattern NB, which crosses the overlap sensor pattern SP1_1. The first portion N1 may be divided into a plurality of sections according to whether the first portion N1 overlaps the mesh lines MSL of the overlap sensor pattern SP1_1. The first portion N1 includes a first section P1, a second section P2, and a third section P3.

The first section P1 may be a portion of the first portion N1, which overlaps the mesh lines MSL. Referring to FIG. 4A, the first sections P1 are cross-hatched for convenience of description.

The first section P1 may entirely overlap the overlap sensor pattern SP1_1. That is, the entire surface of the first section P1 may overlap the overlap sensor pattern SP1_1. The first section P1 overlaps a portion of the mesh lines constituting the overlap sensor pattern SP1_1 in a plan view. The first section P1 may overlap a portion of the first mesh line MSL1 or a portion of the second mesh line MSL2.

The first section P1 may have a shape extending along the overlapped mesh lines. That is, the first section P1 may extend in a direction parallel to the mesh lines while overlapping the mesh lines in a plan view. Accordingly, the first section P1 may overlap the mesh lines of the overlap sensor pattern SP1_1. According to the exemplary embodiment, the first section P1 may be provided in plurality, and each of the first sections P1 may have a shape of a line overlapping a portion of the second mesh line MSL2 and extending in the fifth direction D5 or a shape of a line overlapping a portion of the first mesh line MSL1 and extending in the fourth direction D4.

However, this is merely an exemplary illustration, and the exemplary embodiments are not limited thereto. For example, the first section P1 may have various shapes overlapping the overlap sensor pattern SP1_1 in a plan view. For example, the first section P1 may have a bent shape such as a zigzag shape or a mesh shape as long as the first section P1 may extend along the mesh lines of the overlap mesh pattern SP1_1 while overlapping the mesh lines. Although the first section P1 may have various shapes as long as the first section P1 line-overlaps or point-overlaps the overlap sensor pattern SP1_1, in particular, the mesh lines constituting the overlap sensor pattern SP1_1.

A second section P2 may be a portion of the first portion N1 that does not overlap the mesh lines MSL. According to the exemplary embodiment, the first portion N1 may include one second section P2 and two first sections P1 disposed spaced apart from each other with the second section P2 disposed therebetween. The second section P2 connects the plurality of first sections P1. The second section P2 and the two first sections P1 are integrally connected to each other to form the first portion N1 having an unitary shape.

Portions of the mesh lines MSL of the overlap sensor pattern SP1_1 overlapping the second section P2 may be removed. Accordingly, the overlap sensor pattern SP1_1 may further include a cutting portion MSL-CP defined in an area in which the overlapping sensor pattern SP1_1 overlaps the second section P2.

The cutting portion MSL-CP may be a portion defined by removing a portion of the mesh lines MSL so that the mesh lines MSL do not overlap the second section P2. The plurality of openings MSL-OP defined by the mesh lines MSL may be opened to each other in the cutting portion MSL-CP to form an integrated opening. According to the exemplary embodiment, the overlap sensor pattern SP1_1 may include a plurality of cutting portions MSL-CP so that the mesh lines are removed according to an area corresponding to the second section P2. Accordingly, the first portion N1 may include the second section P2 that is not overlapping the overlap sensor pattern SP1_1 in a plan view.

In FIGS. 3 and 4A, the first portion N1 has a zigzag shape including portions extending in the fourth direction D4 and the fifth direction D5. However, this is merely an exemplary illustration, and the exemplary embodiments are not limited thereto. For example, the first portion N1 may has a shape of a line extending in a single direction or a shape including a plurality of lines extending in directions different from each other. According to the exemplary embodiments, the first portion N1 may have various shapes as long as the first portion N1 crosses the overlap sensor pattern SP1_1.

The second portion N2 may be a portion crossing the second sensor pattern SP2 of the third connecting pattern NB. A plurality of second portions N2 may be provided to be disposed spaced apart from each other with the first portion N1 disposed therebetween.

The third portion N3 may be a portion crossing the third sensor pattern NP of the third connecting pattern NB. The third portion N3 may be a portion connected to the third sensor pattern NP. A plurality of third portions N3 may be provided to be spaced apart from each other with the first portion N1 disposed therebetween.

The third connecting pattern NB may have the same width as that of the mesh lines MSL. However, this is merely an exemplary illustration, and the exemplary embodiments are not limited thereto. For example, the third connecting pattern NB may be formed by a conductive pattern having a width greater than that of the mesh lines MSL.

Referring to FIGS. 3 and 4B, two first sensor patterns SP1_1 and SP1_2, two second sensor patterns SP2, two third sensor patterns NP, and a first connecting pattern BP1 constitute a second conductive layer A2 that is different from the first conductive layer A1.

The first sensor patterns SP1_1 and SP1_2, the second sensor patterns SP2, and the third sensor patterns NP are spaced apart from each other in a plan view. The second connecting pattern BP2 connects the second sensor patterns SP2 to each other. The second connecting pattern BP2 may include the mesh lines MSL. According to the exemplary embodiment, the second sensor patterns SP2 and the second connection pattern BP2 may have an unitary shape and may be integrally formed at the same time. However, this is merely an exemplary illustration, and the exemplary embodiments are not limited thereto. For example, the second sensor patterns SP2 and the second connection pattern BP2 may be disposed on different layers and independently formed.

Contact portions CH_S may be defined in the first sensor patterns SP1_1 and SP1_2. The contact portions CH_S of the first sensor patterns SP1_1 and SP1_2 may be defined in an area overlapping the first connecting pattern BP1 of the first sensor patterns SP1_1 and SP1_2. The contact portions CH_S of the first sensor patterns may pass through the insulation layer ILD (refer to FIG. 2B) disposed between the first and second conductive layers A1 and A2 to contact or electrically connect the first sensor patterns SP1_1 and SP1_2.

The third sensor patterns NP are spaced apart from each other in the first direction with the second sensor patterns SP2 and the second connecting pattern BP2 disposed therebetween. Contact portions CH_N may be defined in the third sensor patterns NP. The contact portions CH_N of the third sensor patterns NP may be defined in an area overlapping the third connecting pattern NB of the third sensor patterns NP. The contact portions CH_N of the third sensor patterns may pass through the insulation layer ILD to contact or electrically connect the third sensor patterns NP.

According to the exemplary embodiment, the third connecting pattern NB may partially cross the first sensor patterns SP1_1 and SP1_2 and not cross the first sensor patterns SP1_1 and SP1_2 in the cutting portion MSL-CP. Accordingly, the area of the third connecting pattern NB crossing the first sensor patterns SP1_1 and SP1_2 may be greater than the area of the third connecting pattern NB overlapping the first sensor patterns SP1_1 and SP1_2.

For example, the area of the third connecting pattern NB crossing the overlap sensor pattern SP1_1 may have a surface area of the first portion N1, which may be referred to as a crossed area AR_N1 of the first portion N1. In contrast, the area of the third connecting pattern NB overlapping the overlap sensor pattern SP1_1 may have a surface area of the third connecting pattern NB overlapping the overlap sensor pattern SP1_1 in the third direction D3, which may be referred to as an overlapping area. Accordingly, the overlapping area may be the area of the first sections P1.

The first sections P1 have a surface area less than that of the first portion N1. According to an exemplary embodiment, as a portion of the overlap sensor pattern SP1_1, which overlaps the third connecting pattern NB, is removed, the overlap surface area between the overlap sensor pattern SP1_1 and the third connecting pattern NB may be decreased. Accordingly, an electric signal of the first sensor patterns SP1_1 and SP1_2 overlapping the third connecting pattern NB may have a reduced effect on the third connecting pattern NB.

According to the exemplary embodiments, a sensing error, which may be caused by the third sensing electrode NE recognizing the electric signal applied to the first sensing electrode TE1 as a noise, may be prevented or reduced, and, accordingly, the issue of increased noise to normal signal ratio may be prevented or reduced. According to the exemplary embodiments, the noise caused by the display unit DU (refer to FIG. 2B) disposed on a lower portion may be isolated and stably sensed. Therefore, an electronic device according to the exemplary embodiments may provide a stable input sensing environment by preventing or reducing decreased signal to noise ratio.

Figure 5A:
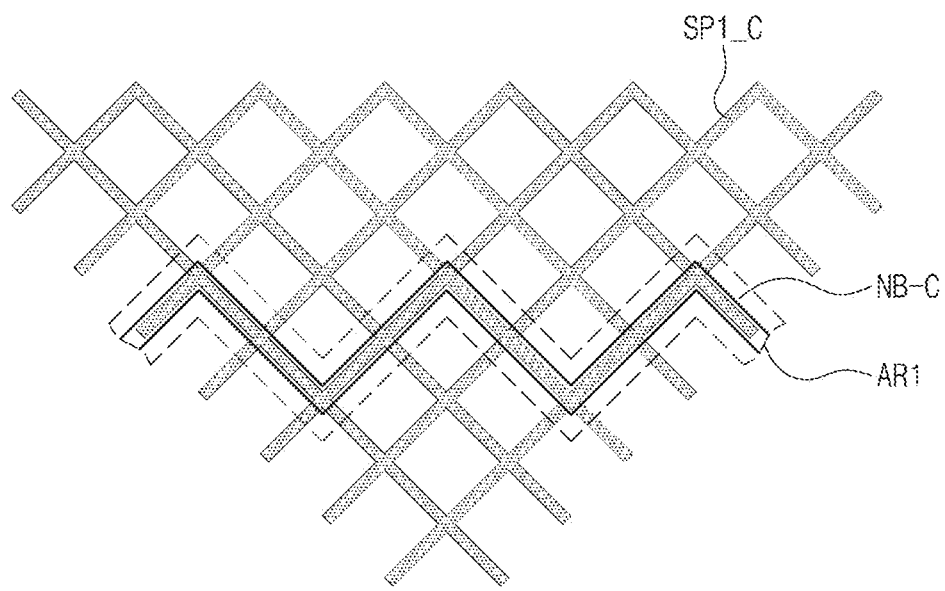
FIG. 5A is a plan view illustrating a portion of an input sensing unit, according to a comparative embodiment.
Figure 5B:
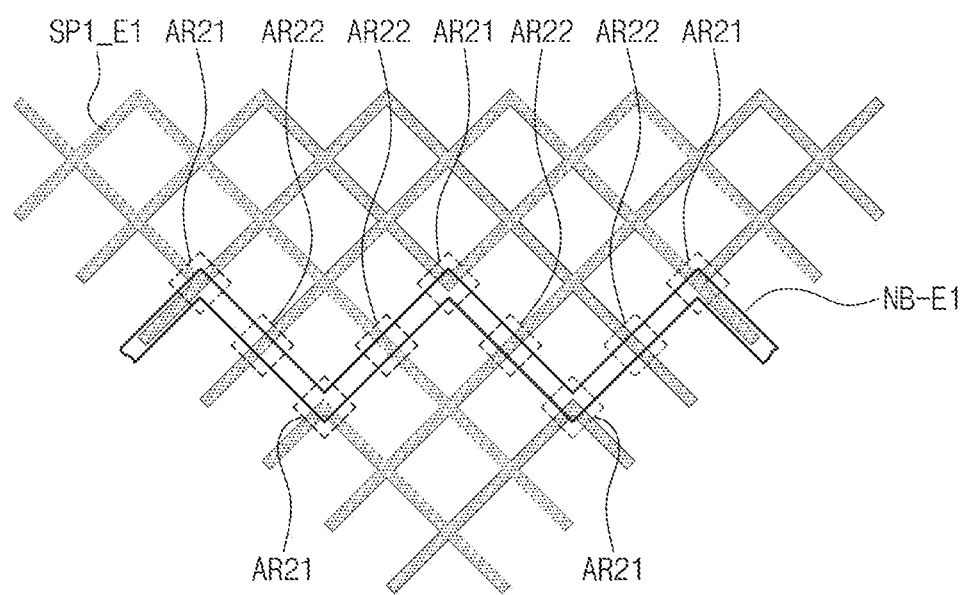
FIG. 5B is a plan view illustrating a portion of an input sensing unit according to an exemplary embodiment.
Figure 5C:
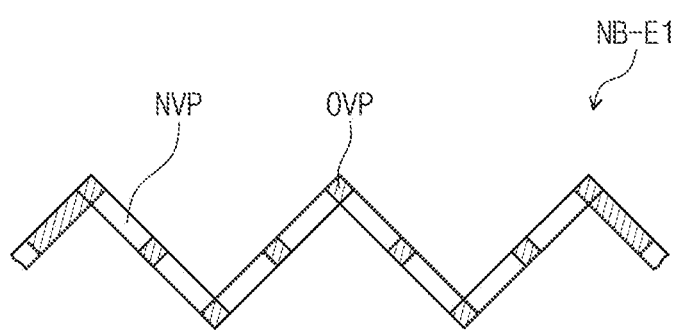
FIG. 5C is a plan view illustrating a portion of components in FIG. 5B, according to an exemplary embodiment.

FIG. 5A is a plan view illustrating a portion of an input sensing unit according to a comparative embodiment. FIG. 5B is a plan view illustrating a portion of an input sensing unit according to an exemplary embodiment. FIG. 5C is a plan view illustrating a portion of components in FIG. 5B, according to the exemplary embodiment.

For convenience of description, a portion of a connecting pattern NB-C of the comparative embodiment illustrated in FIG. 5A and a connecting pattern NB-E1 of the exemplary embodiment illustrated in FIG. 5B may correspond to the third connecting pattern NB of the first conductive layer A1 illustrated in FIG. 4A, and a portion of a first sensor pattern SP1_C of the comparative embodiment illustrated in FIG. 5A and a first sensor pattern SP1_E1 of the exemplary embodiment illustrated in FIG. 5B may correspond to the overlap sensor pattern SP1_1 of the second conductive layer A2 illustrated in FIG. 4B, and a portion of the connecting pattern NB_E1 according to an exemplary embodiment in FIG. 5B is illustrated in FIG. 5C. Portions of the connecting pattern NB-C of the comparative embodiment and portions of the connecting pattern NB-E1 of the exemplary embodiment may correspond to the first portion N1 of the third connecting pattern NB illustrated in in FIG. 4A. Hereinafter, an input sensing unit according the exemplary embodiment will be described with reference to FIGS. 5A, 5B, and 5C. The same or similar elements as those described in FIGS. 1, 2A, 2B, 3, 4A, and 4B are designated the same reference symbols, and redundant description will be omitted.

Referring to FIG. 5A, the connecting pattern NB-C according to the comparative embodiment (hereinafter, referred to as a "comparative connecting pattern") is disposed to cross the first sensor pattern SP1_C according to the comparative embodiment (hereinafter, referred to as a "comparative first sensor pattern"). Here, the comparative connecting pattern NB_C may entirely overlap the comparative first sensor pattern SP1_C. Accordingly, an overlap area AR1 overlapping the first sensor pattern SP1_C in the comparative connecting pattern NB_C corresponds to an entire portion crossing the first sensor pattern SP1_C.

That is, according to a comparative embodiment, the portion crossing the first sensor pattern SP1_C in the comparative connecting pattern NB_C may have a surface area that is substantially the same as that of the overlap area AR1. Accordingly, since the comparative connecting pattern NB_C may be coupled to the first sensor pattern SP1_C in the overlap area AR1, electric signal variation of the first sensor pattern SP1_C may have a great affect on electric signal variation of the comparative connecting pattern NB_C.

In contrast, as illustrated in FIG. 5B, a connecting pattern NB-E1 according to an exemplary embodiment of the invention is disposed to cross a first sensor pattern SP1_E1 according to the principles of the invention. Here, the connecting pattern NB-E1 may only partially overlap the first sensor patterns SP1_E1.

The connecting pattern NB-E1 may include a plurality of overlap areas AR21 and AR22 overlapping the first sensor pattern SP_E1. The plurality of overlap areas AR21 and AR22 may be spaced apart from each other along the connecting pattern NB-E1. The first overlap areas AR21 may be areas overlapping a plurality of mesh lines, and the second overlap areas AR22 may be areas overlapping a single mesh line.

The single mesh line overlapping in the second overlap areas AR22 may extend in a direction crossing the connecting pattern NB-E1. Accordingly, the mesh lines overlapping the connecting pattern NB-E1 and extending in a direction parallel to the connecting pattern NB-E1 may be partially removed.

The first and second overlap areas AR21 and AR22 may be spaced apart from each other along the connecting pattern NB-E1. Referring to FIG. 5C, the connecting pattern NB-E1 may include a plurality of overlap portions OVP respectively corresponding to the first and second overlap areas AR21 and AR22 and a connecting portions NVP disposed between the overlap portions OVP to connect the overlap portions OVP to each other.

According to the exemplary embodiment, when the portion crossing the first sensor pattern SP1_E1 in the connecting pattern NB-E1 is the portion illustrated in FIG. 5C, the first sensor pattern SP1_E1 may restrictively overlap only the overlap portions OVP of the connecting pattern NB-E1. That is, the portion crossing the first sensor pattern SP1_E1 in the connecting pattern NB-E1 may have a surface area that is a sum of surface areas of the overlap portions OVP and the connecting portions NVP, and the surface area overlapping the first sensor pattern SP1_E1 in the connecting pattern NB-E1 may be the sum of surface areas of the overlap portions OVP.

The first sensor pattern SP1_E1 may have various shapes as long as the surface area overlapping the connecting pattern NB-E1 is reduced. However, the exemplary embodiments are not limited thereto. According to the exemplary embodiment, only a portion overlapping the connecting pattern NB-E1 and extending in a direction parallel to the connecting pattern NB-E1 in the first sensor pattern SP1_E1 is removed, and the overlap surface area between the connecting pattern NB-E1 and the first sensor pattern SP1_E1 may be effectively reduced.

Figure 6:
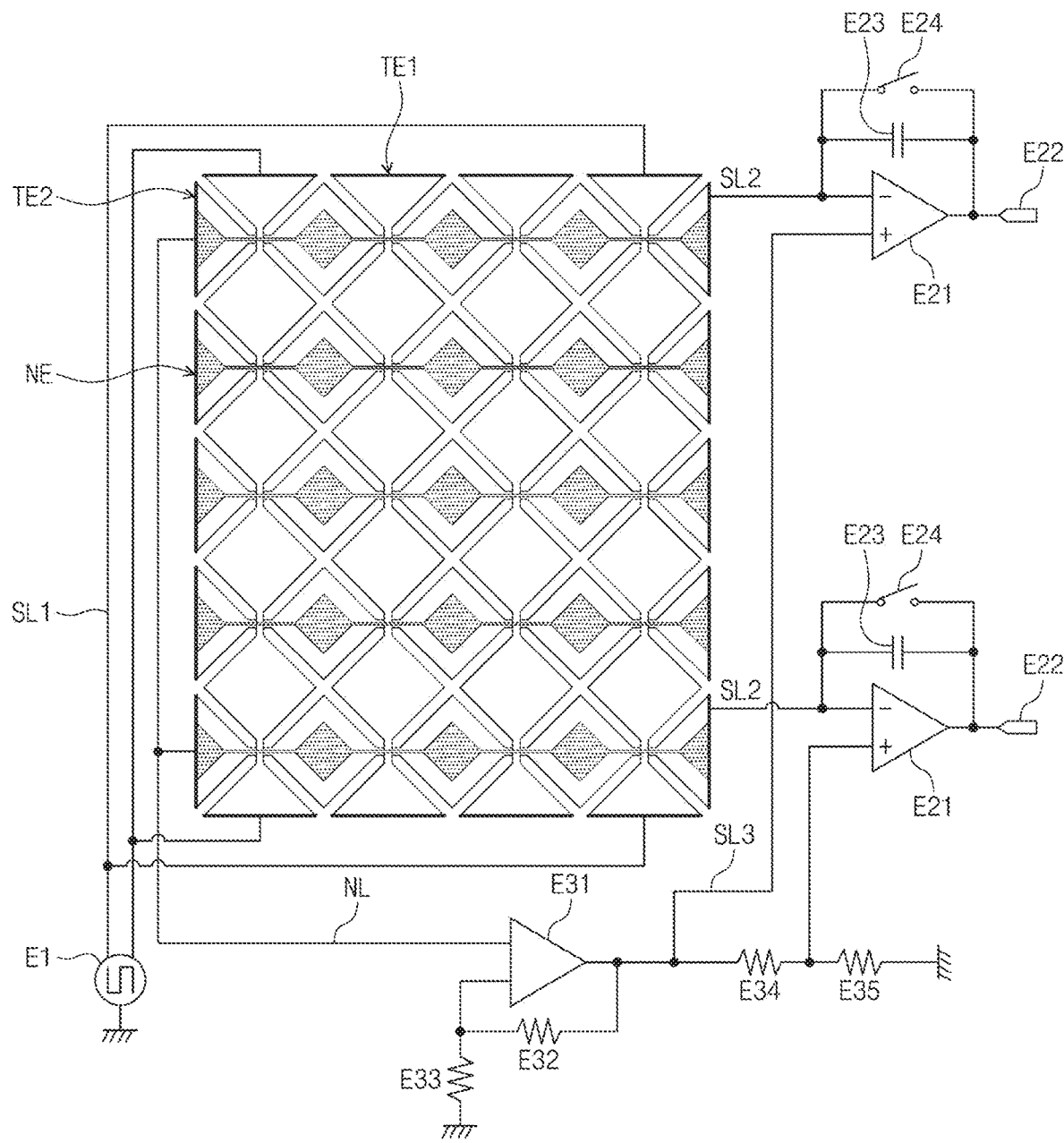
FIG. 6 is a schematic view of an electronic device according to an exemplary embodiment.
Figure 7:
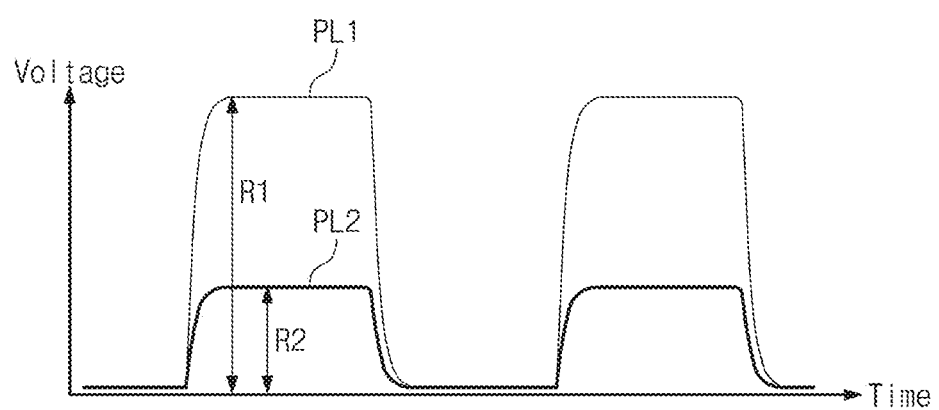
FIG. 7 is a graph showing a noise sensing result plots according to aq comparative example and an exemplary embodiment.

FIG. 6 is a schematic perspective view of an electronic device according to an exemplary embodiment. FIG. 7 is a graph showing a noise sensing result plot according to an exemplary embodiment. For convenience of description, driving elements related to electric signal transmission are schematically illustrated in FIG. 6, and result plots according to a comparative embodiment and an exemplary embodiment are illustrated together in FIG. 7. Hereinafter, an electronic device according to an exemplary embodiment will be described with reference to FIGS. 6 and 7. Meanwhile, the same elements as those described in FIGS. 1, 2A, 2B, 3, 4A, 4B, 5A, 5B, and 5C are designated by the same reference symbols, and redundant description will be omitted.

Referring to FIG. 6, detailed shapes of first, second, and third sensing electrodes TE1, TE2, and NE are omitted, and only the electric connections between them are illustrated. As illustrated in FIG. 6, the first sensing electrode TE1 receives an electric signal from a first electronic element E1 through a first line SL1. The first electronic element E1 may supply a driving signal to the first sensing electrode TE1. The driving signal may be a preset voltage. According to the exemplary embodiment, the driving signal may be an alternating current (AC) voltage.

The second sensing electrode TE2 and the first sensing electrode TE1 may provide capacitance therebetween. The second sensing electrode TE2 may output a response signal through a second line SL2. The response signal may include signal components having different driving frequencies. The response signal may be varied according to positions of the first and second sensing electrodes TE1 and TE2 and whether the external touch TC (refer to FIG. 1) is applied. Accordingly, the response signal may substantially include sensing information of the external touch TC.

The response signal may be transmitted to the second electronic element through the second line SL2. The second electronic element may include a differential amplifier. For example, as illustrated in FIG. 6, the second electronic element may include an amplifying element E21 and a capacitor E23.

The amplifying element E21 is connected to the second line SL2 and a fourth line SL3. The amplifying element E21 receives a reference signal through the fourth line SL3. The second electronic element E21 may transmit an amplified difference between a response signal received through the second line SL2 and a reference signal received through the fourth line SL3. The second electronic element may further include a switching element E24 for controlling driving of the second electronic element.

The second electronic element may further include an analog-digital converting element E22. The analog-digital converting element E22 may covert an analog signal outputted through the amplifying element 21 into a digital signal and supply the converted signal to the electronic device. The electronic device may receive and process the digital signal to acquire information regarding the external touch TC.

The electronic device according to an exemplary embodiment further includes a third sensing electrode NE. The third sensing electrode NE may serve to detect noise as described above. The noise includes an electric effect generated between the display unit DU (refer to FIG. 2B) and the input sensing unit SU.

As illustrated in FIG. 6, the third sensing electrode NE may be coupled to the second electrode EL2 (refer to FIG. 2B) of the display unit DI. Accordingly, the third sensing electrode NE may have an electric potential corresponding to that of the second electrode EL2. The electric potential for each area of the third sensing electrode NE may produce an electric signal outputting the third sensing electrode NE and provided to the third electronic element through the third line NL.

The third electronic element may include an amplifying element E31 and a plurality of resistance elements E32, E33, E34, and E35. The third electronic element amplifies and filters an electric signal received through the third line NL and supplies the amplified and filtered electric signal to the above-described second electronic element. Here, the electric signal may be differentially supplied to a corresponding position of the second sensing electrode TE by using the resistance elements E34 and E35. An electric signal including noise information may be supplied to the second electronic element as the reference signal.

According to an exemplary embodiment, as the third sensing electrode NE for detecting noise is further included, the noise information generated by the display unit DU may be reflected to detect the external touch TC. Accordingly, reduction in touch sensitivity caused by the noise may be prevented or reduced.

Meanwhile, as described above, the third sensing electrode NE may detect an electric signal of the overlapping second electrode EL2. Accordingly, as the surface area in which the third sensing electrode NE overlaps the first or second sensing electrode TE1 or TE2 increases, the third sensing electrode NE may detect the electric signal of the first sensing electrode TE1 or the electric signal of the second sensing electrode TE2 as the noise signal equal to the signal of the second electrode EL2.

Referring to FIG. 7, a first plot PL1 is a time-voltage graph representing an electric signal recognized at a noise sensing electrode corresponding to the third sensing electrode of a comparative embodiment, and a second plot PL2 is a time-voltage graph representing an electric signal recognized at the third sensing electrode of an exemplary embodiment. The first plot PL1 may substantially correspond to a plot of an exemplary embodiment including the comparative connecting pattern NB-C (refer to FIG. 5A) in FIG. 5A, and the second plot PL2 may substantially correspond to a plot of an exemplary embodiment including the connecting pattern NB-E1 in FIG. 5B.

As illustrated in FIG. 7, a highest electric potential R2 of the second plot PL2 is less than a highest electric potential R1 of the first plot PL1 during the same time interval. Referring to the comparative embodiment corresponding to the first plot PL1, the connecting pattern NB-C entirely overlaps the first sensing electrode TE1, and therefore, the highest electric potential R1 is greater due to the electric signal applied to the first sensing electrode TE1.

On the other hand, referring to an exemplary embodiment corresponding to the second plot PL2, the overlap surface area between the connecting pattern NB-E1 and the first sensing electrode TE1 is reduced, and therefore, the highest electric potential R2 correspondingly smaller, due to the electric signal of the first sensing electrode TE1. The highest electric potential R2 of the second plot PL2 may be formed only by an electric signal applied to the second electrode EL2.

According to an exemplary embodiment, as the surface area overlapping the first sensing electrode TE1 in the third sensing electrode NE is reduced, in the situation in which the first sensing electrode TE1 is recognized as a noise may be prevented. Accordingly, according to an exemplary embodiment, the electronic device having a stable touch sensing environment may be provided.

Figure 8A:
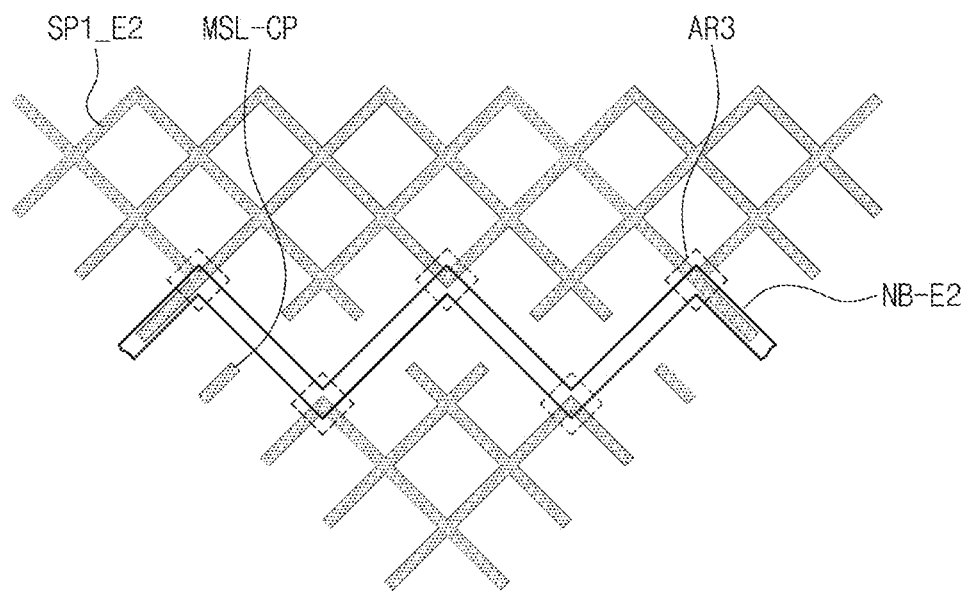
FIGS. 8A, 8B, and 8C are plan views illustrating portions of an input sensing unit according to exemplary embodiments.
Figure 8B:
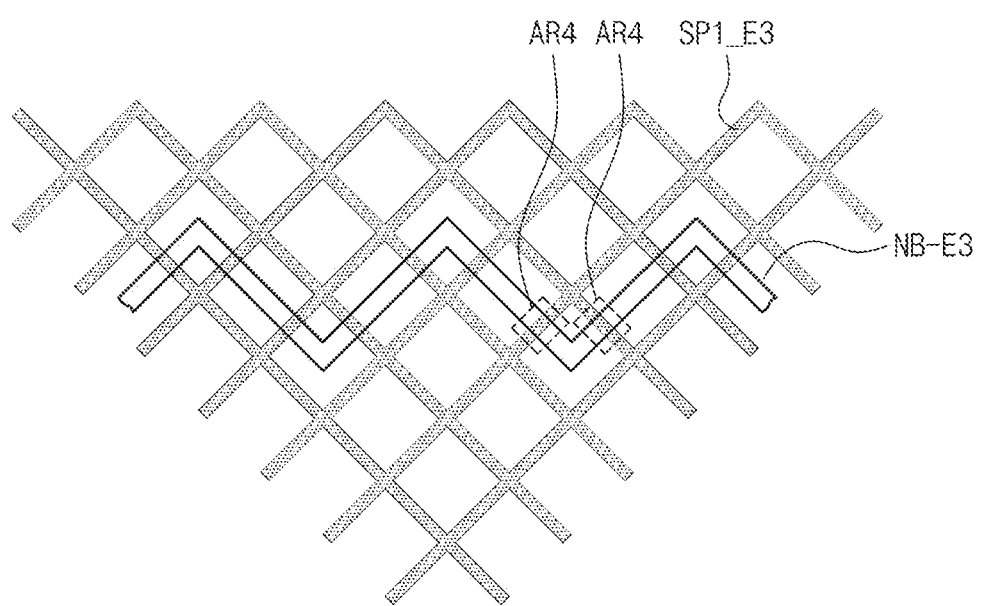
Figure 8C:
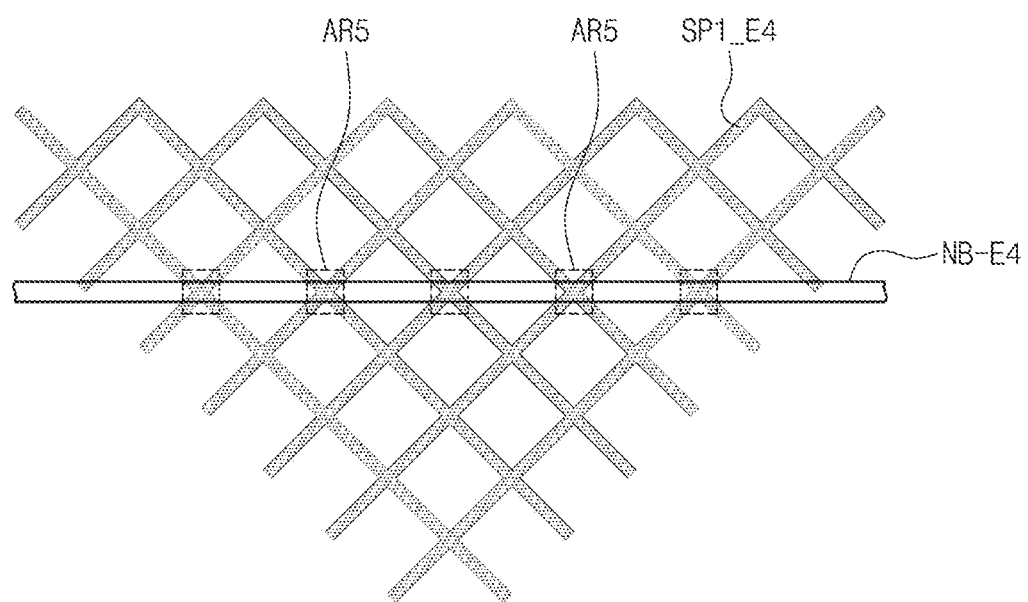

FIGS. 8A, 8B, and 8C are plan views illustrating portions of an input sensing unit according to the exemplary embodiments. For convenience of description, FIGS. 8A, 8B, and 8C illustrate the area corresponding to FIG. 5B. Hereinafter, an input sensing unit according an exemplary embodiment will be described with reference to FIGS. 8A, 8B, and 8C. The same or similar elements as those described in FIGS. 1, 2A, 2B, 3, 4A, 4B, 5A, 5B, 5C, 6, and 7 are designated by the same reference symbols, and redundant description will be omitted.

Referring to FIG. 8A, a connecting pattern NB-E2 may include a plurality of overlap areas AR3. The overlap areas AR3 may be spaced apart from each other along the connecting pattern NB-E2. For convenience of description, each of the overlap areas AR3 has a surface area corresponding to an overlap point.

The overlap areas AR3 may be areas overlapping cross points at which at least two mesh lines of the mesh lines constituting the first sensor pattern SP1_E2 cross. The first sensor pattern SP1_E2 may have a shape in which mesh lines in an area corresponding to the second overlap areas AR22 of the first sensor pattern SP1_E1 (refer to FIG. 5B) are also removed.

Accordingly, the first sensor pattern SP1_E2 may further include a cutting portion MSL-CP defined in an area corresponding to the second overlap areas AR22. The connecting pattern NB-E2 may include at least a portion of an area non-overlapping the first sensor pattern SP1_E2. Accordingly, the area overlapping the connecting pattern NB-E2 may be further reduced in comparison with that of the first sensor pattern SP1_E1 in FIG. 5B.

Referring to FIG. 8B, a first sensor pattern SP1_E3 may partially overlap a connecting pattern NB-E3 without cutting mesh lines. The connecting pattern NB-E3 may not overlap the cross points of the mesh lines.

Accordingly, overlap areas AR4 overlapping the first sensor pattern SP1_E3 in the connecting pattern NB-E3 may be an area in which a single mesh line crosses. Each of mesh lines overlapping the connecting pattern NB-E3 among the mesh lines extends in a direction overlapping the connecting pattern NB-E3. The connecting pattern NB-E3 may include at least a portion of an area non-overlapping the first sensor pattern SP1_E3.

According to the exemplary embodiment, no portion of the first sensor pattern SP1_E3 is removed and the position and shape of the connecting pattern NB-E3 are changed, the overlap area AR4 between the first sensor pattern SP1_E3 and the connecting pattern NB-E3 may be reduced.

Referring to FIG. 8C, a connecting pattern NB-E4 may extend in a direction different from mesh lines. The connecting pattern NB-E4 may extend in a different direction from those in which a plurality of mesh lines constituting the first sensor pattern SP1_E4 extend. According to the exemplary embodiment, the connecting pattern NB-E4 has a shape of a substantially straight line extending in a diagonal direction with respect to each of the mesh lines. For example, the connecting pattern NB-E4 has a shape of a straight line extending in the first direction D1.

The connecting pattern NB-E4 may point-overlap the first sensor patterns SP1_E4. The connecting pattern NB-E4 may overlap the cross points, at which the mesh lines cross, of the first sensor patterns SP1_E4. Accordingly, overlap areas AR5 are arranged in a diagonal direction with respect to the mesh lines to overlap the cross points of the mesh lines.

In the connecting pattern NB-E4, an area overlapping the first sensor pattern SP1-E4 is limited to a surface area of the overlap areas AR5. Accordingly, the connecting pattern NB-E4 may extend to overlap openings of the mesh lines to partially overlap the first sensor pattern SP1-E4 in a plan view and may include at least a portion of an area non-overlapping the first sensor pattern SP1-E4.

According to the exemplary embodiments, an area in which the first sensor pattern SP1_2 non-overlapping the connecting pattern NB-E2 may be variously designed. Also, although the first sensor pattern SP1_3 is not partially removed, the connecting pattern NB-E3 may be varied in position, or the connecting pattern NB-E4 crossing the first sensor pattern SP1_4 may be varied in shape, so that the overlap areas AR3, AR4, and AR5 respectively between the connecting patterns NB-E2, NB-E3, and NB-E4 and the first sensor patterns SP1_2, SP1_3, and SP1_4 may be reduced.

Figure 9A:
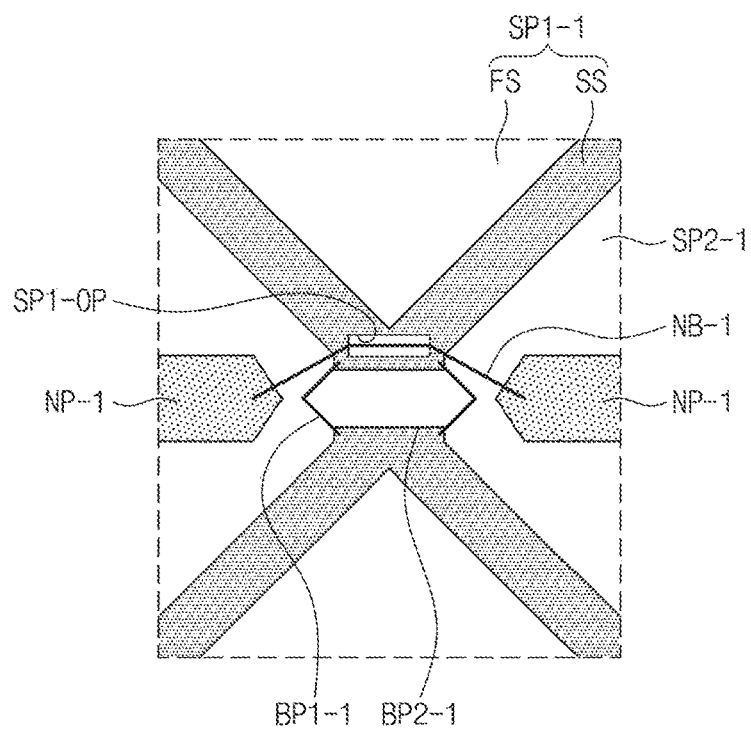
FIGS. 9A and 9B are plan views illustrating partial areas of an input sensing unit according to an exemplary embodiment.
Figure 9B:
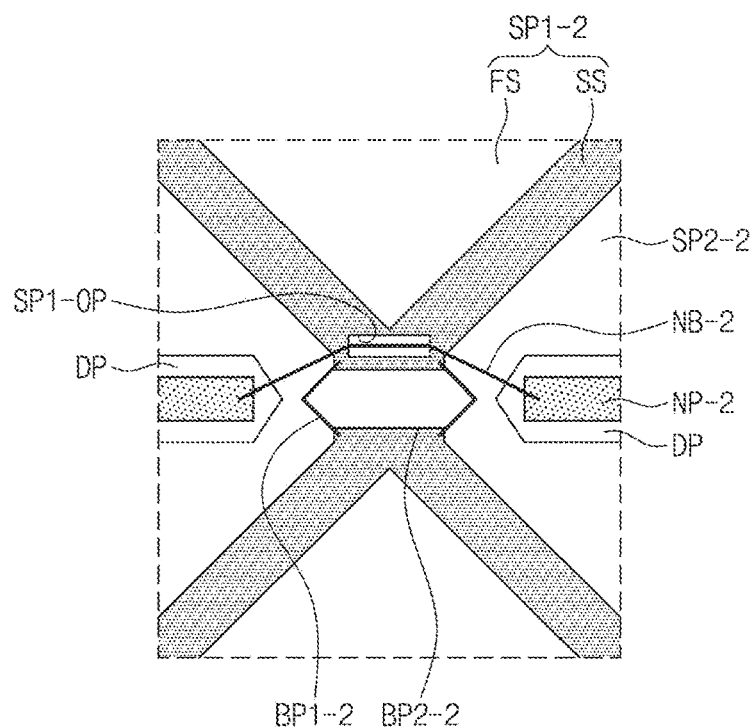

FIGS. 9A and 9B are plan views illustrating partial areas of an input sensing unit according to an exemplary embodiment. In FIGS. 9A and 9B, an area in which one node is illustrated is mainly illustrated for convenience of description. Hereinafter, an input sensing unit according an exemplary embodiment will be described with reference to FIGS. 9A and 9B. The same or similar elements as those described in FIGS. 1, 2A, 2B, 3, 4A, 4B, 5A, 5B, 5C, 6, 7, 8A, and 8B are designated by the same reference symbols, and redundant description will be omitted.

Referring to FIG. 9A, the input sensing unit may include a first sensor pattern SP1-1, a second sensor pattern SP2-1, and a third sensor pattern NP-1, a first connecting pattern BP1-1, a second connecting pattern BP2-1, and a third connecting pattern NB-1. Each of the first sensor pattern SP1-1, the second sensor pattern SP2-1, and the third sensor pattern NP-1 may be provided by a single conductive pattern.

The first sensor pattern SP1-1 may include a floating portion FS and a sensor portion SS. The floating portion FS and the sensor portion SS are spaced apart from each other in a plan view. The floating portion FS and the sensor portion SS may be electrically insulated from each other.

In the first sensor pattern SP1-1, the sensor portion SS may be a portion substantially providing capacitance for detecting a touch. The first connecting pattern BP1-1 connects the sensor portion SS.

According to the exemplary embodiment, as the first sensor pattern SP1-1 includes the floating portion FS, a surface area occupied by the first sensor pattern SP1-1 besides the sensor portion SS may be reduced. Accordingly, an electric effect caused by the lower display unit DU (refer to FIG. 2B) may be reduced to decrease the noise generation.

Meanwhile, a predetermined opening SP1-OP may be defined in the sensor portion SS. The opening SP1-OP may reduce a surface area overlapping the first sensor pattern SP1-1 among portions in which the third connecting pattern NB-1 crosses the first sensor pattern SP1-1. Accordingly, the third sensing electrode NP-1 detecting an electric signal as a noise may be prevented or reduced to provide a stable touch sensing environment.

Referring to FIG. 9B, the input sensing unit may further include a dummy pattern DP. A first sensor pattern SP1-2, a first connecting pattern BP1-2, and a second connecting pattern BP2-2 may be substantially the same as the first sensor pattern SP1-1, the first connecting pattern BP1-1, and the second connecting pattern BP2-1 in FIG. 9A.

A second sensor pattern SP2-2 may be spaced apart from the dummy pattern DP and the third sensor pattern NP-2 in a plan view. Accordingly, the second sensor pattern SP2-2 may have a shape surrounding the dummy pattern DP and the third sensor pattern NP-2.

The dummy pattern DP may be disposed between the second sensor pattern SP2-2 and the third sensor pattern NP-2. The dummy pattern DP may be electrically insulated from the second sensor pattern SP2-2 and the third sensor pattern NP-2. As the input sensing unit according to an exemplary embodiment further includes the dummy pattern DP, a surface area of the second sensor pattern SP2-2 and a surface area of the third sensor pattern NP-2 may be reduced, and, accordingly, the noise generated from the display unit DU may decrease.

According to the exemplary embodiment, the input sensing unit having the improved touch sensing accuracy by reflecting the noise generated while sensing the input applied from the outside and the electronic device including the same may be provided. Also, according to the exemplary embodiment, reduction of the signal to noise ratio may be prevented or reduced to provide the stable touch sensing environment.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An input sensing unit comprising:
   first sensor patterns arranged in a first direction;
   first connecting patterns connecting the first sensor patterns;
   second sensor patterns arranged in a second direction;
   second connecting patterns connecting the second sensor patterns and being insulated from the first connecting patterns;
   third sensor patterns; and
   third connecting patterns connecting the third sensor patterns and being insulated from the first and second connecting patterns, the third connecting patterns having at least one portion having a first surface area crossing one of the first sensor patterns, wherein the at least one portion comprises a second surface area overlapping the first sensor pattern, and wherein the second surface area is smaller than the first surface area, wherein the first sensor patterns, the second sensor patterns, and the third sensor patterns are disposed on a same layer, and wherein the third connecting patterns are disposed on a different layer to the first sensor patterns, the second sensor patterns, and the third sensor patterns.

2. The input sensing unit of claim 1, wherein the at least one portion comprises:
a first section overlapping the first sensor pattern; and
a second section not overlapping the first sensor pattern, and
wherein the first sensor pattern comprises an opening overlapping the second section.

3. The input sensing unit of claim 2, wherein the first section comprises a plurality of areas spaced apart from each other with the second section disposed therebetween.

4. The input sensing unit of claim 2, wherein at least one of the first sensor patterns comprise:
a plurality of first mesh lines each extending in a first direction; and
a plurality of second mesh lines each extending in a second direction crossing the first direction at cross points at which the first mesh lines and the second mesh lines cross each other, the plurality of first and second mesh lines defining a plurality of mesh openings,
wherein the first section overlaps at least one of cross points and the second section overlaps at least one of the mesh openings.

5. The input sensing unit of claim 4, wherein the first section extends in at least one of the first direction and the second direction, and overlap at least one of the first mesh lines and the second mesh lines, and
wherein the at least one of the mesh lines extends in a direction crossing the first section.

6. The input sensing unit of claim 4, wherein the first section has a generally linear shape extending in a different direction than the first direction and the second direction.

7. The input sensing unit of claim 2, wherein at least one of the first sensor patterns comprises:
a plurality of first mesh lines extending in a first direction; and
a plurality of second mesh lines extending in a second direction crossing the first direction defining cross points and openings overlapping the first mesh lines,
wherein the first section is disposed between the cross points to overlap the first mesh lines and the second mesh lines and not overlap the cross points, and
wherein the second section overlaps the openings.

8. The input sensing unit of claim 7, wherein the first section has a generally zigzag shape comprising a portion extending in the first direction and a portion extending in the second direction.

9. The input sensing unit of claim 1, wherein the first connecting pattern is disposed on a layer different from that of the second connecting pattern, and the first connecting pattern is disposed on the same layer as that of the third connecting pattern.

10. The input sensing unit of claim 9, further comprising an insulation layer disposed between the first connecting pattern and the second connecting pattern, wherein at least a part of the second sensor patterns is formed to pass through the insulation layer and be connected to the second connecting pattern, and wherein at least a part of the third sensor patterns is formed to pass through the insulation layer and be connected to the third connecting pattern.

11. The input sensing unit of claim 1, wherein the second sensor pattern surrounds the third sensor pattern.

12. An electronic device comprising:
a display unit configured to display an image; and
an input sensing unit comprising a touch sensor including:
a first sensing electrode disposed on the display unit to receive a first signal;
a second sensing electrode configured to receive a second signal and form capacitance with the first sensing electrode; and
a noise sensor comprising a third sensing electrode configured to receive a third signal different from the first and second signals,
wherein the third sensing electrode comprises:
a plurality of sensor patterns including first sensor patterns, second sensor patterns, and third sensor patterns arranged in a first direction; and
a plurality of connecting patterns including first connector patterns, second connector patterns, and third connector patterns disposed between adjacent sensor patterns of the plurality of sensor patterns to connect the adjacent sensor patterns to each other, and
wherein at least some of the plurality of connecting patterns comprise:
a plurality of overlap portions spaced apart from each other and overlapping the first sensing electrode; and
a connecting portion disposed between the overlap portions and not overlapping the first sensing electrode,
wherein the first sensor patterns, the second sensor patterns, and the third sensor patterns are disposed on the same layer, and
wherein the third connecting patterns are disposed on a different layer to the first sensor patterns, the second sensor patterns, and the third sensor patterns.

13. The electronic device of claim 12, wherein the first sensing electrode comprises an opening overlapping the connecting portion.

14. The electronic device of claim 13, wherein the first sensing electrode comprises a plurality of mesh lines crossing each other at cross points,
wherein at least one of the plurality of overlap portions overlap one of the cross points of the mesh lines, and
wherein the mesh lines do not overlap the connecting portions.

15. The electronic device of claim 12, wherein at least one of the connecting patterns comprise:
a first portion having a first surface area crossing the first sensing electrode; and
a second portion having a second surface area overlapping the first sensing electrode, and
wherein the second surface area is less than the first surface area.

16. The electronic device of claim 12, wherein the first sensing electrode comprises a plurality of mesh lines crossing each other, and crossing the connecting patterns at the plurality of overlap portions.

17. The electronic device of claim 12, wherein the first sensing electrode comprises: the plurality of first sensor patterns arranged in a second direction crossing the first direction; and the plurality of first connecting patterns respectively disposed between adjacent ones of the plurality of first sensor patterns to connect adjacent first sensor patterns to each other, wherein the second sensing electrode further comprises:

the plurality of second sensor patterns arranged in the first direction; and the plurality of second connecting patterns respectively disposed between adjacent ones of the plurality of second sensor patterns to connect adjacent second sensor patterns to each other, and wherein the connecting patterns are spaced apart from the first connecting patterns and the second connecting patterns.

18. The electronic device of claim 17, wherein the connecting patterns are disposed on the same layer as that of the first connecting patterns and disposed on a layer different from that of the second connecting pattern.

19. The electronic device of claim 17, wherein the first sensing electrode is supplied with an alternating current voltage.

20. The electronic device of claim 12, wherein the display unit comprises an organic light emitting diode comprising a first electrode, a second electrode disposed on the first electrode, and a light emitting layer disposed between the first electrode and the second electrode, and wherein the noise sensor is disposed on the second electrode.

* * * * *